US 9,553,119 B2

(12) United States Patent
Choi et al.

(10) Patent No.: US 9,553,119 B2
(45) Date of Patent: Jan. 24, 2017

(54) METHODS OF FORMING AN IMAGE SENSOR

(71) Applicant: Samsung Electronics Co., Ltd., Suwon-si, Gyeonggi-do (KR)

(72) Inventors: Joon-Young Choi, Suwon-si (KR); Taegon Kim, Seoul (KR); JunHyun Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/849,187

(22) Filed: Sep. 9, 2015

(65) Prior Publication Data

US 2016/0079288 A1    Mar. 17, 2016

(30) Foreign Application Priority Data

Sep. 12, 2014    (KR) ........................ 10-2014-0120904

(51) Int. Cl.
*H01L 27/146*    (2006.01)

(52) U.S. Cl.
CPC ....... *H01L 27/1463* (2013.01); *H01L 27/1464* (2013.01); *H01L 27/14614* (2013.01); *H01L 27/14621* (2013.01); *H01L 27/14627* (2013.01); *H01L 27/14638* (2013.01); *H01L 27/14685* (2013.01); *H01L 27/14689* (2013.01); *H01L 27/14698* (2013.01)

(58) Field of Classification Search
None
See application file for complete search history.

(56) References Cited

U.S. PATENT DOCUMENTS

| | | | |
|---|---|---|---|
| 6,069,058 A | 5/2000 | Hong | |
| 6,869,860 B2 | 3/2005 | Belyansky et al. | |
| 7,187,017 B2 | 3/2007 | Sawase et al. | |
| 8,384,177 B2 | 2/2013 | Endo | |
| 8,853,811 B2 | 10/2014 | Lai et al. | |
| 2008/0057612 A1* | 3/2008 | Doan | H01L 21/76237 438/57 |
| 2012/0149213 A1 | 6/2012 | Nittala et al. | |
| 2013/0321685 A1 | 12/2013 | Ahn et al. | |

FOREIGN PATENT DOCUMENTS

| | | |
|---|---|---|
| JP | 2006-287117 A | 10/2006 |
| JP | 2009-224585 A | 10/2009 |
| JP | 2010-050145 A | 3/2010 |
| KR | 10-2000-0020242 A | 4/2000 |
| KR | 10-2005-0097646 A | 10/2005 |
| KR | 10-2006-0002057 A | 1/2006 |
| KR | 10-2006-0022709 A | 3/2006 |
| KR | 10-200700293669 A | 3/2007 |
| KR | 10-0729742 B1 | 6/2007 |
| KR | 10-0967677 B1 | 7/2010 |

* cited by examiner

*Primary Examiner* — Asok K Sarkar
(74) *Attorney, Agent, or Firm* — Myers Bigel, P.A.

(57) ABSTRACT

Methods of forming an image sensor are provided. A method of forming an image sensor includes forming a trench in a substrate to define a unit pixel region of the substrate. The method includes forming an in-situ-doped passivation layer on an exposed surface of the trench. The method includes forming a capping pattern on the in-situ-doped passivation layer, in the trench. The method includes forming a photoelectric conversion region in the unit pixel region. Moreover, the method includes forming a floating diffusion region in the unit pixel region.

20 Claims, 18 Drawing Sheets

METHODS OF FORMING AN IMAGE SENSOR

CROSS-REFERENCE TO RELATED APPLICATION

This U.S. non-provisional patent application claims priority under 35 U.S.C. §119 to Korean Patent Application No. 10-2014-0120904, filed on Sep. 12, 2014, in the Korean Intellectual Property Office, the entire content of which is hereby incorporated herein by reference.

BACKGROUND

The present disclosure relates to image sensors. An image sensor is a semiconductor device configured to convert optical images into electrical signals. The image sensor may be classified into two types: a charge coupled device (CCD) type and a complementary metal-oxide-semiconductor (CMOS) type. A CMOS-type image sensor may be referred to as a contact image sensor (CIS). A CIS image sensor may include a plurality of two-dimensionally arranged pixels, each of which includes a photodiode (PD) that converts incident light into an electrical signal. A variety of technologies are being developed to improve performance of the CIS image sensor.

SUMMARY

Various embodiments of present inventive concepts provide a method of fabricating an image sensor with an improved dark current property. According to various embodiments of present inventive concepts, a method of fabricating an image sensor may include etching a first surface of a substrate to form a trench defining a unit pixel region, the substrate further including a second surface opposite the first surface. The method may include performing an atomic layer deposition process to form a passivation layer conformally covering a surface of the trench, the passivation layer being doped with impurity ions during the atomic layer deposition process. The method may include forming a capping pattern on the passivation layer to fill the trench. The method may include forming a photoelectric conversion part in the unit pixel region. Moreover, the method may include forming a floating diffusion region in the unit pixel region, where the floating diffusion region may be spaced apart from the photoelectric conversion part.

In various embodiments, forming the passivation layer may include: supplying a silicon precursor and the impurity ions to the surface of the trench; and supplying an oxygen precursor to the surface of the trench. The silicon precursor and the oxygen precursor may be reacted with each other, thereby forming a silicon oxide layer doped with the impurity ions on the surface of the trench. In some embodiments, the passivation layer may include a plurality of stacked layers, each of which is doped with the impurity ions, and performing the atomic layer deposition process to form the passivation layer may include performing the atomic layer deposition process to form the plurality of stacked layers doped with the impurity ions. Moreover, in some embodiments, the method may include performing an annealing process on the passivation layer to diffuse the impurity ions from the passivation layer into the substrate.

According to various embodiments, forming the capping pattern may include: forming, using a spin coating process, a capping layer to fill the trench that includes the passivation layer; performing an annealing process on the capping layer; and polishing the capping layer to expose the first surface of the substrate. In some embodiments, the capping layer may include Tonen SilaZene (TOSZ), and forming the capping layer may include forming, using the spin coating process, the capping layer including the TOSZ to fill the trench that includes the passivation layer.

In various embodiments, the method may include forming a transfer gate on the unit pixel region and on the first surface of the substrate, the transfer gate being spaced apart from the floating diffusion region. Moreover, the method may include forming a color filter on the second surface of the substrate to face the photoelectric conversion part, and forming a micro lens on the color filter.

A method of fabricating an image sensor, according to various embodiments, may include etching a first surface of a substrate to form a trench defining a unit pixel region, the substrate further including a second surface opposite the first surface. The method may include performing an atomic layer deposition process to form a passivation layer conformally covering a surface of the trench, the passivation layer being doped with impurity ions during the atomic layer deposition process. The method may include forming a protection layer on the passivation layer. The method may include forming a first capping pattern on the protection layer to partially fill the trench. The method may include forming a second capping pattern on the first capping pattern to fill a remaining space of the trench. The method may include forming a photoelectric conversion part in the unit pixel region of the substrate. Moreover, the method may include forming a floating diffusion region in the unit pixel region of the substrate, the floating diffusion region being adjacent the first surface of the substrate and spaced apart from the photoelectric conversion part.

In various embodiments, forming the passivation layer may include: supplying a silicon precursor and the impurity ions to the surface of the trench; and supplying an oxygen precursor to the surface of the trench, where the silicon precursor and the oxygen precursor are reacted with each other on the surface of the trench, thereby forming a silicon oxide layer doped with the impurity ions. In some embodiments, the passivation layer may include a plurality of stacked layers, each of which is doped with the impurity ions, and performing the atomic layer deposition process to form the passivation layer may include performing the atomic layer deposition process to form the plurality of stacked layers doped with the impurity ions.

According to various embodiments, forming the first capping pattern may include: forming a first capping layer using a spin coating process to fill the trench and cover the protection layer; and etching the first capping layer to expose an upper side surface of the protection layer in the trench. In some embodiments, the method may include performing an annealing process on the passivation layer to diffuse the impurity ions from the passivation layer into the substrate.

In various embodiments, forming the second capping pattern may include: forming a second capping layer using a spin coating process to fill the trench that includes the first capping pattern; and polishing the second capping layer to expose at least the protection layer on the first surface of the substrate. In some embodiments, the method may include performing an annealing process on at least one of the first and second capping patterns. Moreover, the first and second capping patterns may include Tonen SilaZene (TOSZ), and forming the first and second capping patterns may include forming the first and second capping patterns including the TOSZ in the trench.

A method of forming an image sensor, according to various embodiments, may include forming a trench in a substrate to define a unit pixel region of the substrate. The method may include forming an in-situ-doped passivation layer on an exposed surface of the trench. The method may include forming a capping pattern on the in-situ-doped passivation layer, in the trench. The method may include forming a photoelectric conversion region in the unit pixel region. Moreover, the method may include forming a floating diffusion region in the unit pixel region.

In various embodiments, forming the in-situ-doped passivation layer may include forming impurities in the passivation layer without using plasma and without using ion implantation. In some embodiments, the method may include annealing to diffuse the impurities from the passivation layer into the substrate, before forming the capping pattern.

In some embodiments, forming the capping pattern may include forming a first capping pattern to partially fill the trench. Moreover, the method may include: performing a first annealing process on the first capping pattern; forming a second capping pattern on the first capping pattern in the trench; and performing a second annealing process on the second capping pattern.

According to various embodiments, forming the in-situ-doped passivation layer may include performing an atomic layer deposition process to form the in-situ-doped passivation layer. Forming the capping pattern may include using a spin coating process to form the capping pattern on the in-situ-doped passivation layer, in the trench. The method may include performing an annealing process on the capping pattern. The method may include forming a well region in the substrate. The method may include forming a gate pattern in the well region. Moreover, the floating diffusion region may be between the gate pattern and the trench.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
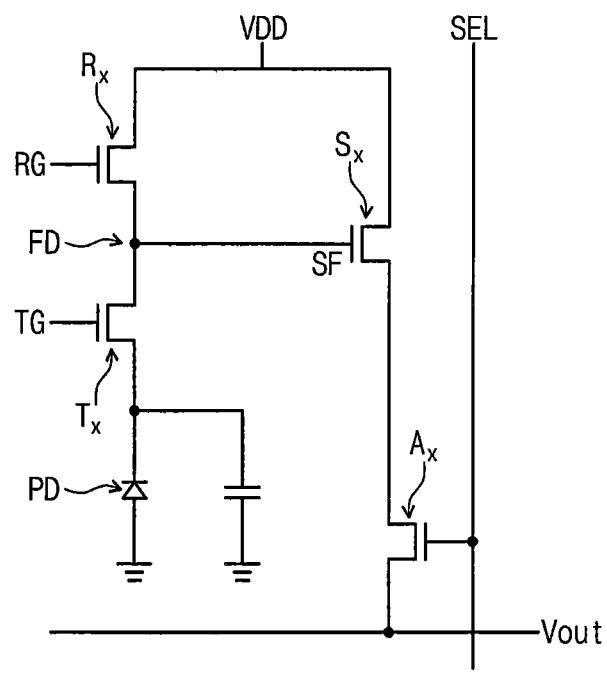
FIG. 1 is a circuit diagram of an image sensor according to example embodiments of present inventive concepts.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a circuit diagram of an image sensor according to example embodiments of the inventive concept.

Referring to FIG. 1, the image sensor may include a plurality of unit pixels, each of which includes a photoelectric conversion device PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively. The photoelectric conversion device PD may be a photodiode including an n-type impurity region and a p-type impurity region. The transfer transistor Tx may include a drain region serving as a floating diffusion region FD. The floating diffusion region FD may also serve as a source region of the reset transistor Rx. The floating diffusion region FD may be electrically connected to the source follower gate SF of the source follower transistor Sx. The source follower gate SF, in conjunction with a constant current source (not shown) provided outside the unit pixel, may serve as a source follower buffer amplifier amplifying a change in electric potential of the floating diffusion region FD and outputting the amplified signal to an output line $V_{out}$.

The source follower transistor Sx may be connected to the selection transistor Ax. The reset transistor Rx, the source follower transistor Sx, and the selection transistor Ax may be shared by adjacent pixels, and this makes it possible to increase an integration density of the image sensor.

Hereinafter, an operation of the image sensor will be described with reference to FIG. 1. Firstly, in a light-blocking state, by applying a power voltage VDD to drain regions of the reset and source follower transistors Rx and Sx and turning on the reset transistor Rx, electric charges may be discharged from the floating diffusion region FD. Thereafter, if the reset transistor Rx is turned-off and external light is incident into the photoelectric conversion device PD, electron-hole pairs may be generated in the photoelectric conversion device PD. Holes may be moved toward the p-type doped region, and electrons may be moved toward and accumulated in the n-type doped region. If the transfer transistor Tx is turned on, the electrons may be transferred to and accumulated in the floating diffusion region FD. A change in amount of the accumulated electrons may lead to a change in gate bias of the source follower transistor Sx, and this may lead to a change in source potential of the source follower transistor Sx. Accordingly, if the selection transistor Ax is turned on, an amount of the electrons may be read out as a signal to be transmitted through a column line.

Figure 2:
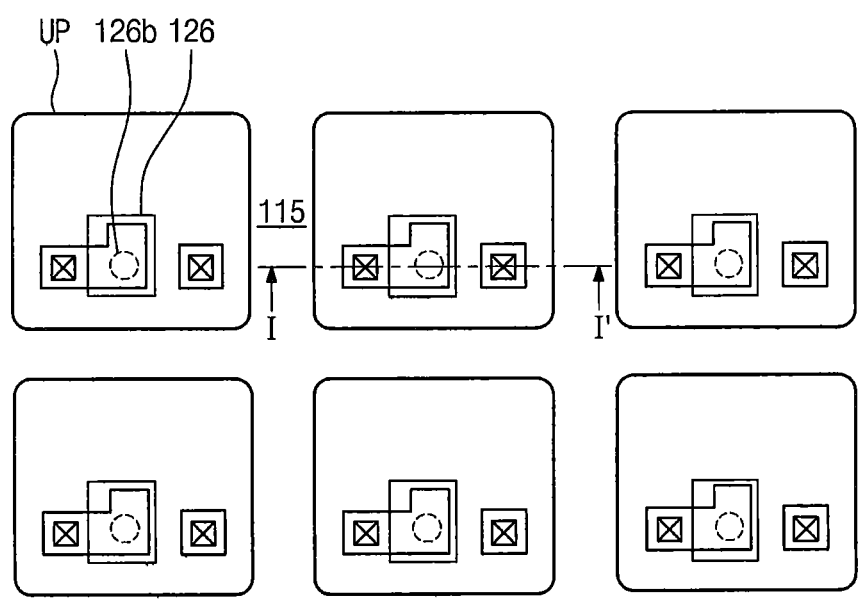
FIG. 2 is a plan view illustrating an image sensor according to example embodiments of present inventive concepts.

FIG. 2 is a plan view illustrating an image sensor according to example embodiments of the inventive concept. FIGS. 3A through 3L are sectional views illustrating a method of fabricating an image sensor according to example embodiments of the inventive concept. In detail, FIGS. 3A, 3B, 3D, and 3F through 3L are sectional views taken along line I-I' of FIG. 2, and FIGS. 3C and 3E are enlarged sectional views showing a portion A of FIG. 3B and a portion A' of FIG. 3D, respectively.

Figure 3A:
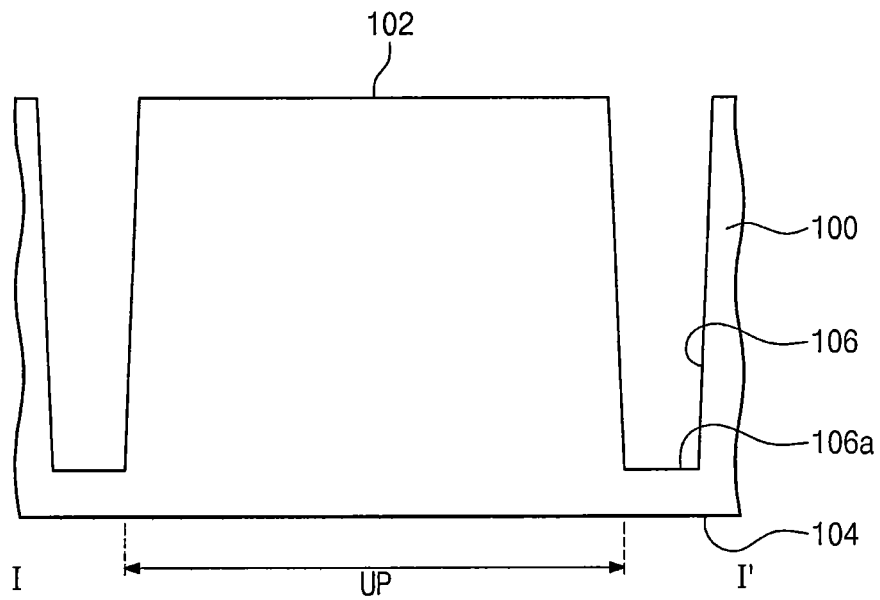
FIGS. 3A, 3B, 3D, and 3F through 3L are sectional views illustrating a method of fabricating an image sensor according to example embodiments of present inventive concepts, taken along line I-I' of FIG. 2.

Referring to FIGS. 2 and 3A, a substrate 100 may have a first surface 102 and a second surface 104 facing each other. The first surface 102 of the substrate 100 may be etched to form a first trench 106 in the substrate 100. The first trench 106 may be formed to have a bottom surface 106a that is closer to the second surface 104 than to the first surface 102. The first trench 106 may be formed to have portions intersecting each other in a mesh shape, defining a unit pixel region UP. For example, the substrate 100 may be a semiconductor substrate (e.g., a silicon substrate, a germanium substrate, a silicon-germanium substrate, a II-VI compound semiconductor substrate, or a III-V compound semiconductor substrate) or a silicon-on-insulator (SOI) substrate.

Figure 3B:
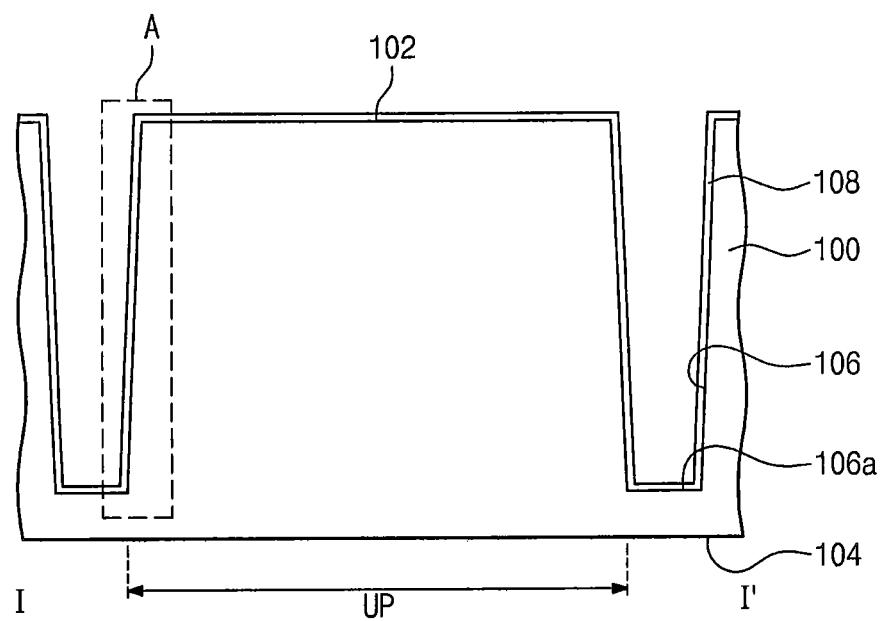
Figure 3C:
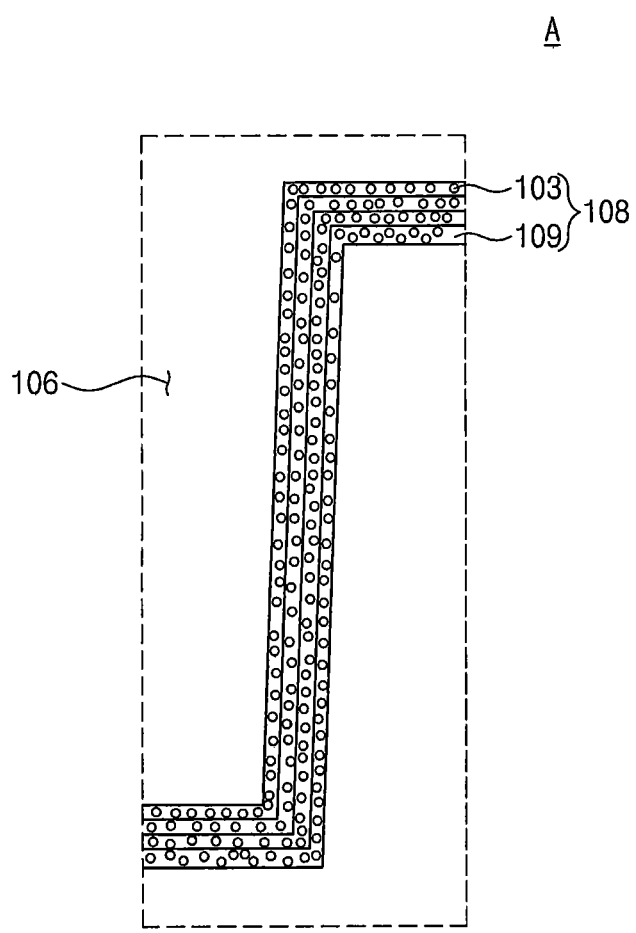
FIGS. 3C and 3E are enlarged sectional views illustrating a method of fabricating an image sensor according to example embodiments of present inventive concepts, and in particular, showing a portion A of FIG. 3B and a portion A' of FIG. 3D, respectively.

Referring to FIGS. 2, 3B, and 3C, a first passivation layer 108 may be formed to conformally cover an inner surface (e.g., an inner surface and the bottom surface 106a) of the first trench 106. For example, the first passivation layer 108 may be formed to conformally cover the inner surface of the first trench 106 and the first surface 102 of the substrate 100. The first passivation layer 108 may be a layer doped with impurity ions 103. The first passivation layer 108 may be formed using an atomic layer deposition (ALD) process. For example, the first passivation layer 108 may be a silicon oxide layer.

The ALD process may include at least one cycle including a first supply step, a first purge step, a second supply step, and a second purge step. In the case of using the ALD process to form the first passivation layer 108, the first supply step may include supplying a silicon (Si) precursor and the impurity ions 103 into a chamber, in which the substrate 100 with the first trench 106 is loaded, and the first purge step may include supplying an argon (Ar) gas into the chamber to remove a non-adsorption fraction of the silicon precursor and the impurity ions 103. The second supply step may include supplying an oxygen precursor into the chamber to react the oxygen precursor with the adsorbed silicon precursor, and the second purge step may include supplying an argon gas into the chamber to remove by-products and some or all of the unreacted oxygen precursor. As a result of the ALD process, a silicon oxide layer doped with the impurity ions 103 may be formed.

In detail, as shown in FIG. 3C, the first passivation layer 108 may include a plurality of thin layers 109, which are sequentially deposited on the inner surface of the first trench 106 and the first surface 102 of the substrate 100. Each of the thin layers 109 may be formed by each process cycle of the ALD process. Each of the thin layers 109 may be formed to contain a plurality of impurity ions 103. The first passivation layer 108 may contain the impurity ions 103 and have, for example, a doping concentration of about $1E^{20}/cm^3$ or higher. In example embodiments, the impurity ions 103 may be boron (B) ions.

The first trench 106 may be formed by etching the substrate 100, and in this case, an inner surface of the first trench 106 may have an etch damage or an unstable surface state. In example embodiments, to improve/cure the damaged surface of the substrate 100 exposed by the first trench 106, an ion implantation process or a plasma process may be performed on the surface of the substrate 100 exposed by the first trench 106. For example, the surface of the substrate 100 exposed by the first trench 106 may be highly doped with impurity ions. However, during the ion implantation process or plasma process, the surface of the substrate 100 exposed by the first trench 106 may be collided by accelerated ions or be exposed by the plasma. This may lead to a secondary damage on the surface of the first trench 106. Especially, such damage may be intensified when the doping concentration is increased. Because the damage on the surface of the first trench 106 has a problem with an increased dark current, the dark current property of the image sensor is declined.

According to example embodiments of the inventive concept, in the ALD process for forming the first passivation layer 108, the impurity ions 103 may be supplied on the substrate 100 in an in-situ manner, and thus, the first passivation layer 108 doped with the impurity ions 103 may be formed on the inner surface of the first trench 106, without using the ion implantation process or plasma process. Accordingly, the first passivation layer 108 may be referred to as an "in-situ-doped passivation layer." An "in-situ-doped passivation layer," as described herein, may refer to doping the first passivation layer 108 with impurities (e.g., the impurity ions 103) as the first passivation layer 108 is formed. In other words, the impurity ions 103 may be introduced into the first passivation layer 108 during its formation, and the in-situ-doped passivation layer including the impurity ions 103 may be formed directly on exposed surfaces of the substrate 100, without performing an ion implantation or plasma process. Accordingly, it may be possible to protect/prevent the surface(s) of the substrate 100 exposed by the first trench 106 from being damaged, when the first passivation layer 108 doped with the impurity ions 103 is formed. Consequently, the dark current property of the image sensor is improved.

Figure 3D:
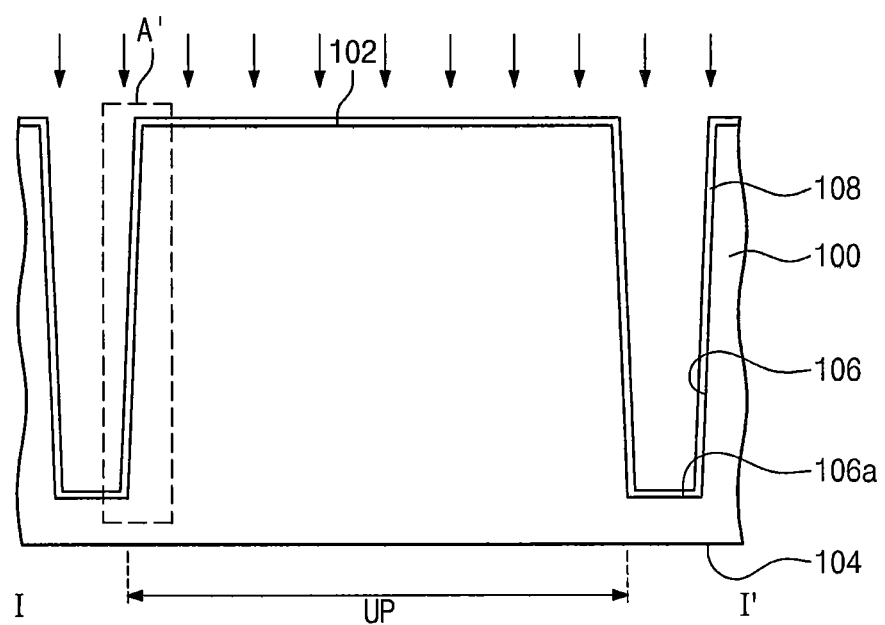
Figure 3E:
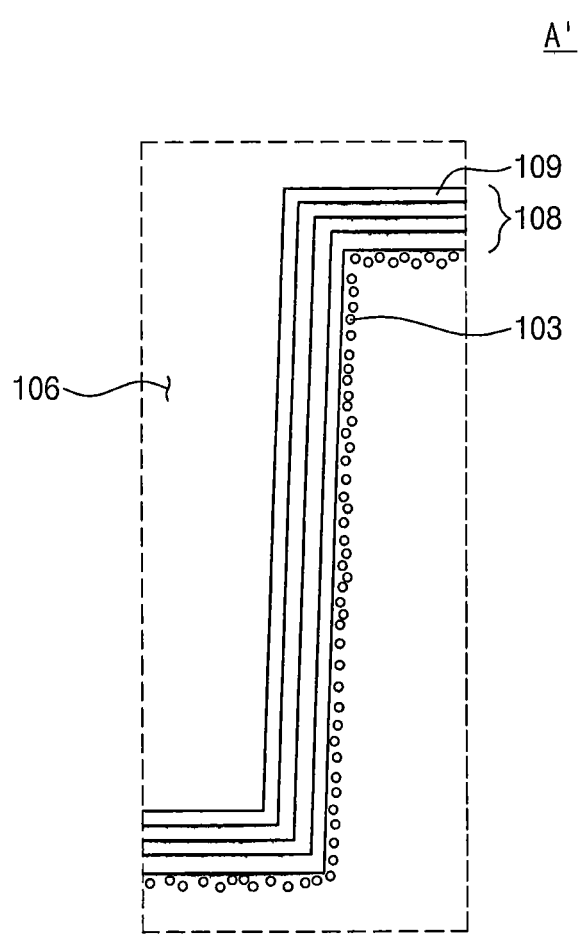

Referring to FIGS. 2, 3D, and 3E, an annealing process may be performed on the first passivation layer 108. During the annealing process, the impurity ions 103 may be diffused from the first passivation layer 108 into the substrate 100. For example, the impurity ions 103 in the first passivation layer 108 may be diffused into the substrate 100 through the inner surface of the first trench 106 and then may be used to remove dangling bonds positioned on the surface of the substrate 100 exposed by the first trench 106. This makes it possible to improve/cure the damaged surface of the substrate 100 exposed by the first trench 106.

Figure 3F:
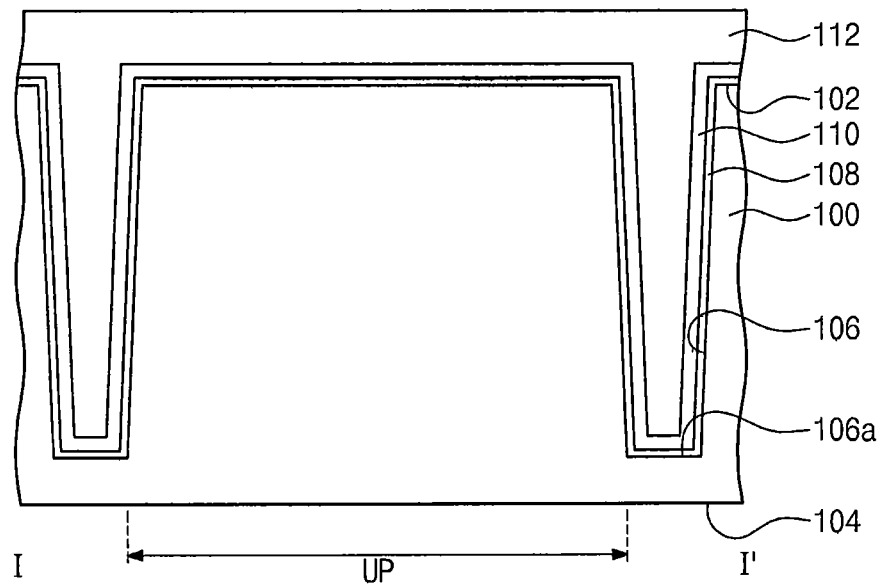

Referring to FIGS. 2 and 3F, a second passivation layer 110 may be formed on the first passivation layer 108. The second passivation layer 110 may be formed to conformally cover the first passivation layer 108 in the first trench 106 and on the first surface 102. The second passivation layer 110 may be provided to have a single or double layered structure including at least one of a middle temperature oxide (MTO) or a high temperature oxide (HTO). The second passivation layer 110 may be formed using, for example, a chemical vapor deposition (CVD) process.

A capping layer 112 may be formed on the second passivation layer 110. The capping layer 112 may be formed to fill the first trench 106 and cover the second passivation layer 110 on the first surface 102 of the substrate 100. For example, the formation of the capping layer 112 may include forming a fluidic insulating material using a spin coating process. Because the capping layer 112 has fluidity, the capping layer 112 can be formed to uniformly fill the first trench 106. As an example, the capping layer 112 may be formed of or include silazane (e.g., Tonen SilaZene/SilaZane (TOSZ)).

Figure 3G:
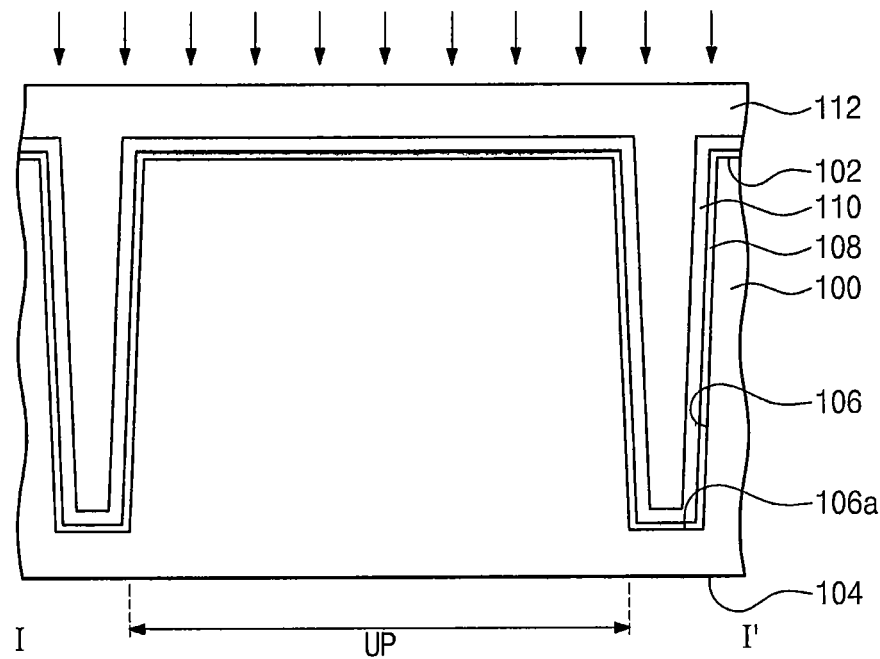

Referring to FIGS. 2 and 3G, an annealing process may be performed on the capping layer 112. For example, a wet annealing process may be performed on the capping layer 112 in an ambient containing hydrogen and oxygen. As a result of the annealing process, impurities may be removed from the capping layer 112.

In example embodiments, the first trench 106 may be formed to have a high aspect ratio. For all that, by virtue of the annealing process, it may be possible to remove (e.g., to reduce the number/quantity of) impurities from the capping layer 112, and thus, the capping layer 112 can have a good insulating property.

Figure 3H:
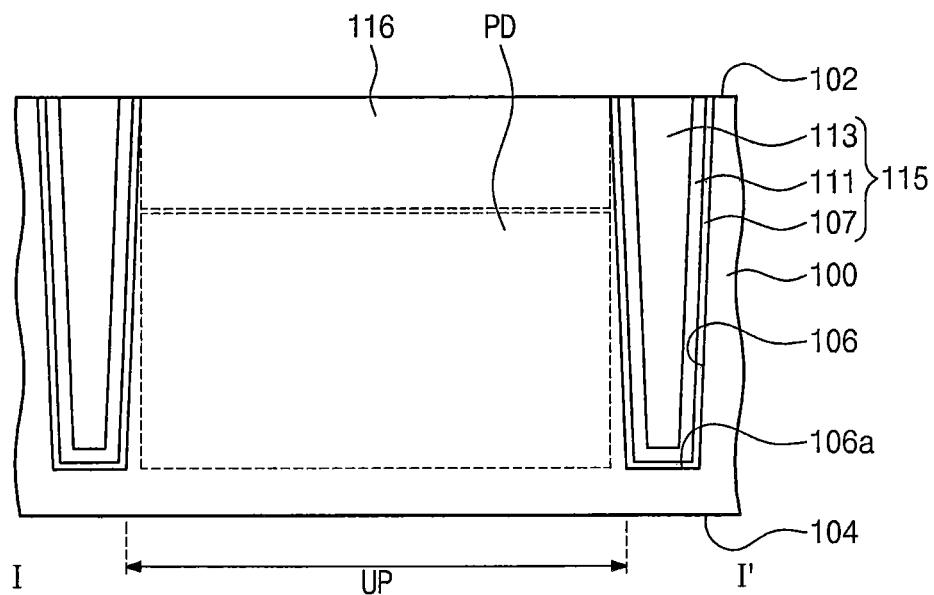

Referring to FIGS. 2 and 3H, a polishing process may be performed on the capping layer 112. For example, the polishing process may be performed to remove the capping layer 112, the second passivation layer 110, and/or the first passivation layer 108 from the first surface 102 of the substrate 100 and to thereby expose the first surface 102 of the substrate 100. Accordingly, a deep device isolation layer 115 may be locally formed in the first trench 106. The deep device isolation layer 115 may include a first passivation pattern 107, a second passivation pattern 111, and a capping pattern 113. In other words, as a result of the polishing process, the first passivation layer 108, the second passivation layer 110, and the capping layer 112 may be localized in the first trench 106 and may be used as (e.g., may become) the first passivation pattern 107, the second passivation pattern 111, and the capping pattern 113, respectively.

A photoelectric conversion device PD may be formed in the unit pixel region UP of the substrate 100. The photoelectric conversion device PD may be formed by performing an ion implantation process on the first surface 102 of the substrate 100. The photoelectric conversion device PD may be doped to have, for example, an n-type conductivity. A well region 116 may be formed in the unit pixel region of the substrate 100. The well region 116 may be formed to have a depth smaller/shallower than that of the photoelectric conversion device PD, when measured from the first surface 102 of the substrate 100. The well region 116 may be formed by performing an ion implantation process on the first surface 102 of the substrate 100. The well region 116 may be doped to have, for example, a p-type conductivity.

Figure 3I:
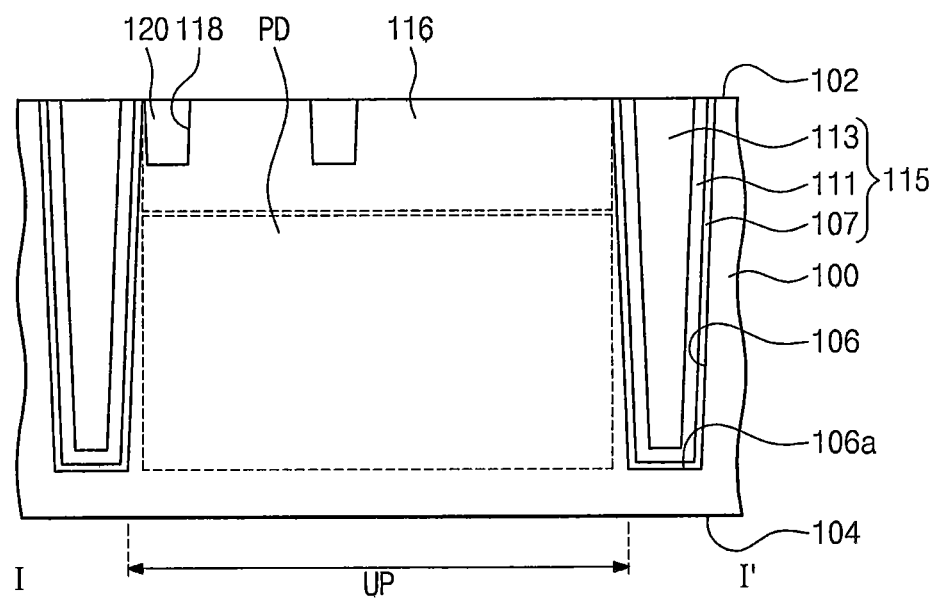

Referring to FIGS. 2 and 3I, a shallow device isolation layer 120 may be formed on the substrate 100. For example, to form the shallow device isolation layer 120, a mask pattern may be formed on the first surface 102 of the substrate 100, and then, a second trench 118 may be formed by etching the first surface 102 of the substrate 100 using the mask pattern as an etch mask. Thereafter, an insulating layer may be formed to fill the second trench 118, and a planarization process may be performed to expose the first surface 102 of the substrate 100 and form the shallow device isolation layer 120 in the second trench 118. In some embodiments, as an alternative to the afore-described sequence of the fabrication process, the shallow device isolation layer 120 may be formed before forming the first trench 106 for the deep device isolation layer 115.

Figure 3J:
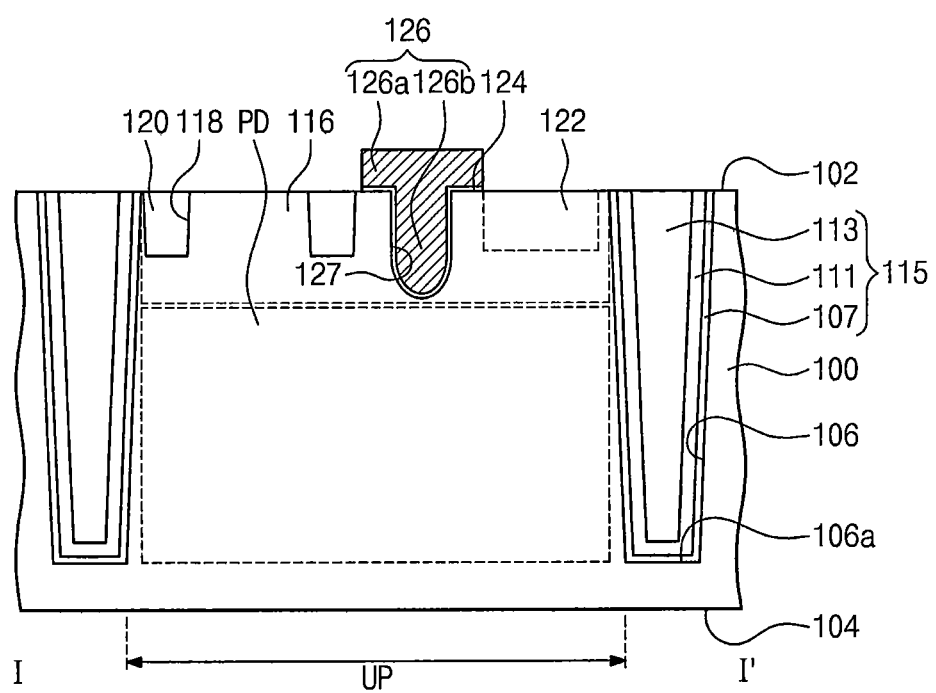

Referring to FIGS. 2 and 3J, a transfer gate 126 may be formed on the first surface 102 of the substrate 100. For example, the transfer gate 126 may be formed on each of the unit pixel regions UP. The transfer gate 126 may include a first gate pattern 126a and a second gate pattern 126b.

In detail, the first surface 102 of the substrate 100 may be etched to form a gate trench 127 in the substrate 100, and then, a gate insulating layer may be formed to conformally and thinly cover the resulting structure including the gate trench 127. Thereafter, a conductive layer may be formed on the first surface 102 of the substrate 100 to fill the gate trench 127, and the gate insulating layer and the conductive layer may be patterned to form a gate insulating layer 124, a first gate pattern 126a, and a second gate pattern 126b. The first gate pattern 126a may be formed in the substrate 100 (e.g., in the well region 116). In some embodiments, the first gate pattern 126a may be formed to have a depth greater/deeper than that of the shallow device isolation layer 120, when measured from the first surface 102 of the substrate 100. The second gate pattern 126b may be formed to have a portion protruding from the first surface 102 of the substrate 100 and may be connected to the first gate pattern 126a.

A floating diffusion region 122 (which may be the floating diffusion region FD of FIG. 1) may be formed in the unit pixel region UP of the substrate 100 and adjacent to the first surface 102. The floating diffusion region 122 may be formed between the transfer gate 126 and the deep device isolation layer 115. The floating diffusion region 122 may be doped to have a conductivity type different from or opposite to that of the well region 116. For example, the floating diffusion region 122 may be doped to have n-type conductivity.

Figure 3K:
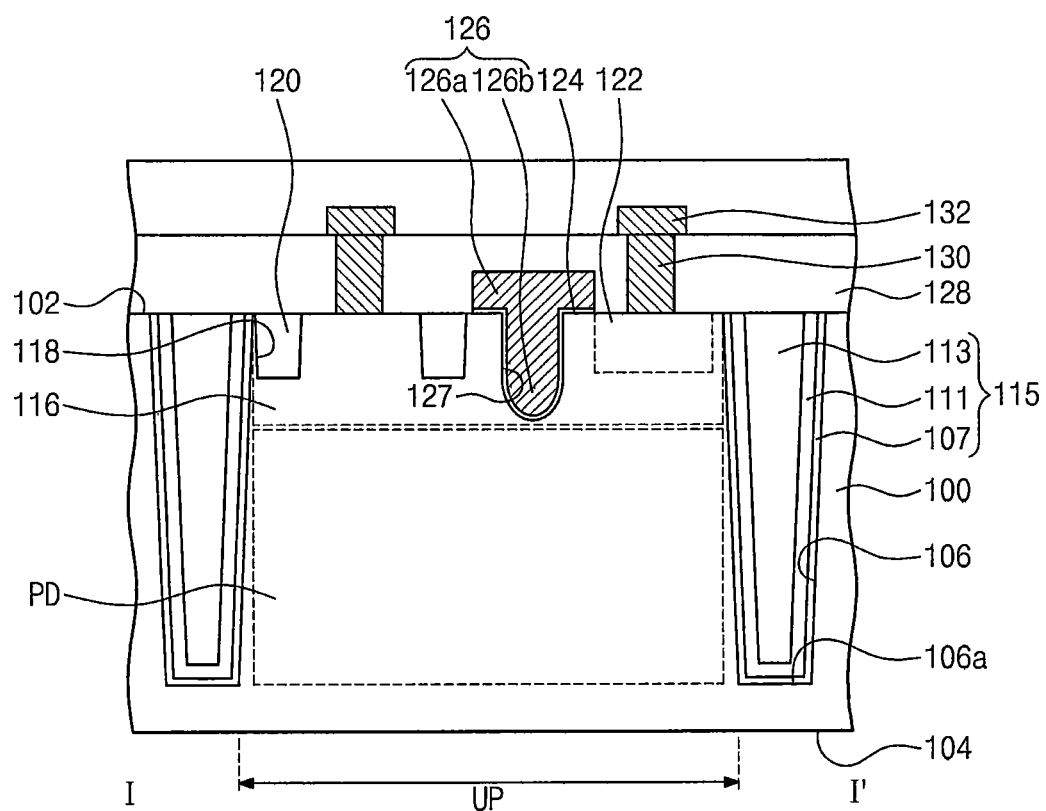

Referring to FIGS. 2 and 3K, an interlayer insulating layer 128 may be formed on the first surface 102 of the substrate 100. The interlayer insulating layer 128 may be formed to cover the deep device isolation layer 115, the shallow device isolation layer 120, the floating diffusion region 122, and the transfer gate 126. The interlayer insulating layer 128 may be formed of or include at least one of, for example, high density plasma (HDP), tetraethyl orthosilicate (TEOS), Tonen SilaZene (TOSZ), spin on glass (SOG), undoped silica glass (USG), or low-k dielectric materials.

Through vias 130 may be formed to penetrate the interlayer insulating layer 128, and interconnection lines 132 may be formed to be in contact with the through vias 130. At least one of the through vias 130 may be in contact with the floating diffusion region 122. The through vias 130 and the interconnection lines 132 may be formed of a metallic material (e.g., copper (Cu), aluminum (Al), or tungsten (W)).

Figure 3L:
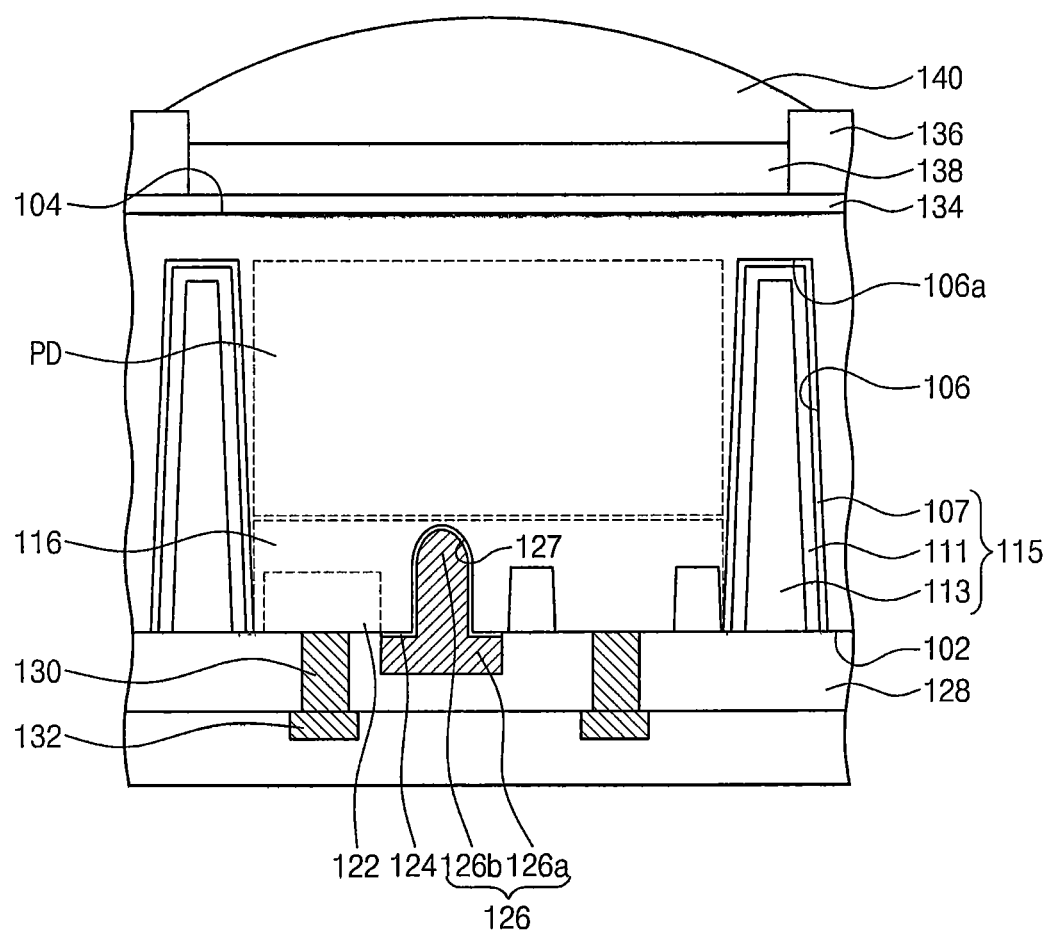

Referring to FIGS. 2 and 3L, an anti-reflecting layer (e.g., anti-reflective/anti-reflection (AR)) 134 may be formed on the second surface 104 of the substrate 100. The anti-reflecting layer 134 may be formed to conformally cover the second surface 104 of the substrate 100. In some embodiments, a separation part 136 may be formed on an edge region of the anti-reflecting layer 134. The separation part 136 may be used in a subsequent process for physically separating a color filter 138 into filter parts, which will be disposed on the unit pixel regions UP, respectively. In some embodiments, the separation part 136 may be formed of air or another type of void/gap.

The color filter 138 may be formed on the anti-reflecting layer 134. The color filter 138 may be formed on each unit pixel region UP. The color filter 138 may be arranged to form a color filter array. As an example, the color filter array may be configured to form a Bayer pattern/array including red, green, and blue filters. As another example, the color filter array may be configured to include yellow, magenta, and cyan filters. In some example embodiments, the color filter array may be configured to include white filters.

A micro lens 140 may be formed on the color filter 138.

FIGS. 4A through 4I are sectional views illustrating a method of fabricating an image sensor according to some example embodiments of present inventive concepts, taken along line I-I' of FIG. 2. For concise description, an element or step previously described with reference to FIGS. 3A through 3L may be identified by a similar or identical reference number without repeating an overlapping description thereof.

Figure 4A:
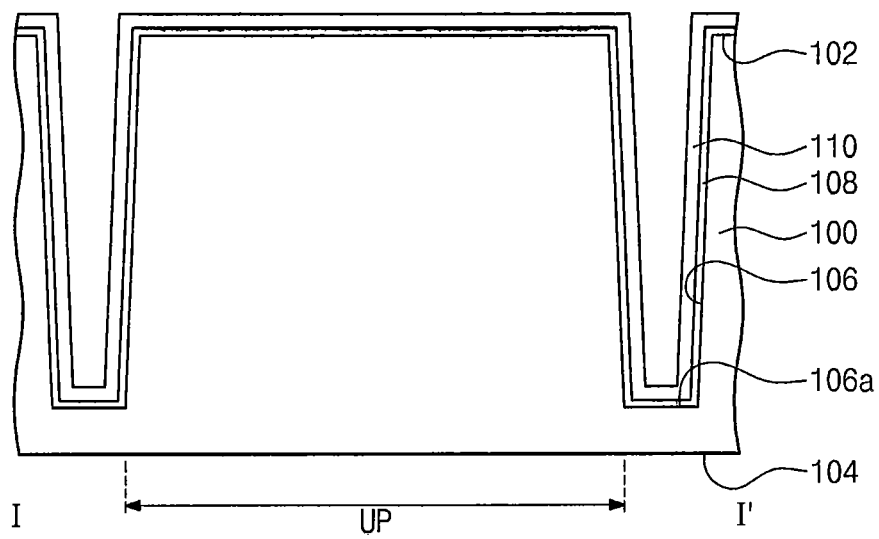
FIGS. 4A through 4I are sectional views illustrating a method of fabricating an image sensor according to example embodiments of present inventive concepts, taken along line I-I' of FIG. 2.

Referring to FIGS. 2 and 4A, the first surface 102 of the substrate 100 may be etched to form the first trench 106 in the substrate 100. The first passivation layer 108 doped with the impurity ions 103 (e.g., as shown in FIG. 3C) may be formed to conformally cover the inner surface of the first trench 106. The first passivation layer 108 may be formed using an ALD process. The first passivation layer 108 may be, for example, a silicon oxide layer. The impurity ions 103 may be for example, boron (B) ions. After the formation of the first passivation layer 108, an annealing process may be performed on the first passivation layer 108 to diffuse the impurity ions 103 from the first passivation layer 108 into the substrate 100, as shown in FIG. 3E.

The second passivation layer 110 may be formed on the first passivation layer 108. The second passivation layer 110 may be provided to have a single or double layered structure including at least one of MTO or HTO. The second passivation layer 110 may be formed by a chemical vapor deposition (CVD) process.

Figure 4B:
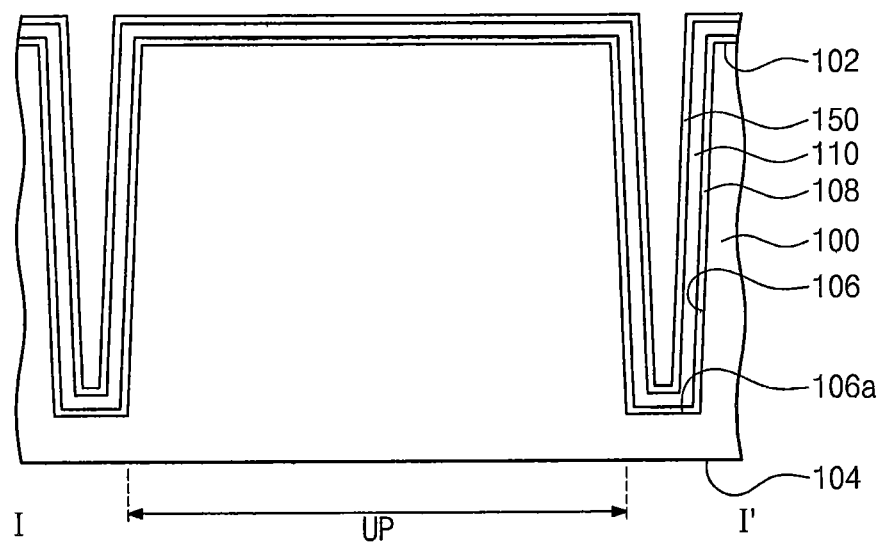

Referring to FIGS. 2 and 4B, a protection layer 150 may be formed on the second passivation layer 110. The protection layer 150 may be formed to conformally cover the second passivation layer 110 in the first trench 106 and on the first surface 102 of the substrate 100. The protection layer 150 may be formed of a material having an etch selectivity with respect to the first and second passivation layers 108 and 110. The protection layer 150 may be a nitrogen-containing layer (e.g., silicon nitride or silicon oxynitride). The protection layer 150 may be formed using one of a chemical vapor deposition (CVD) process, a physical vapor deposition (PVD) process, or an atomic layer deposition (ALD) process.

Figure 4C:
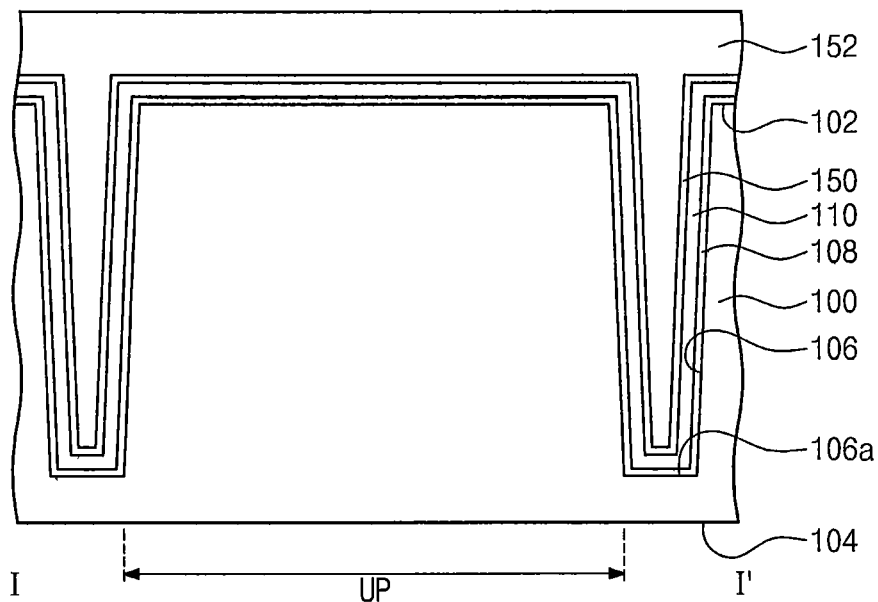

Referring to FIGS. 2 and 4C, a first capping layer 152 may be formed on the protection layer 150. The first capping layer 152 may be formed to fill the first trench 106 and cover the protection layer 150 formed on the first surface 102 of the substrate 100. The first capping layer 152 may be formed by a spin coating process. The first capping layer 152 may be formed of a fluidic insulating material. For example, the first capping layer 152 may be formed of or include Tonen SilaZene (TOSZ).

Figure 4D:
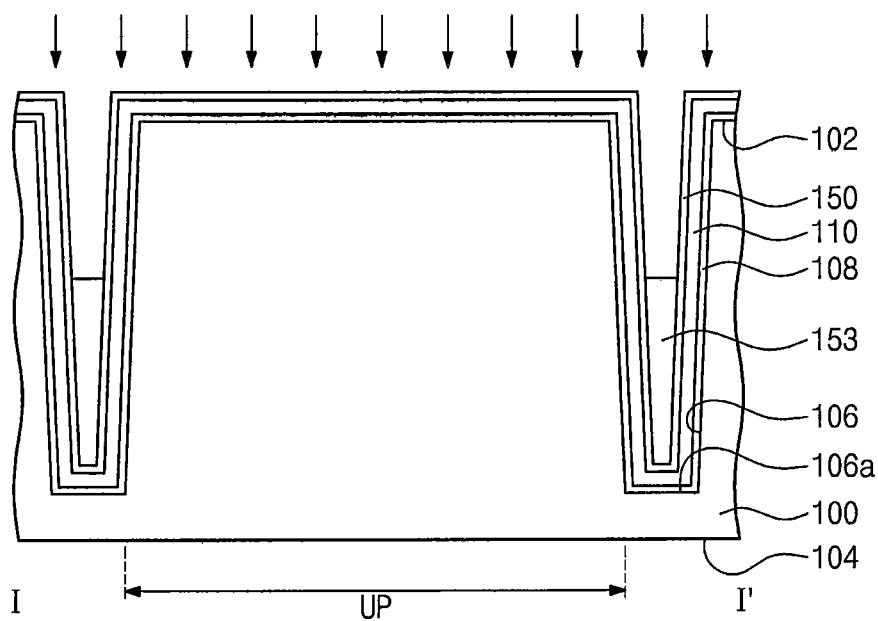

Referring to FIGS. 2 and 4D, a first capping pattern 153 may be formed on the protection layer 150. An etch-back process may be performed on the first capping layer 152 to form the first capping pattern 153 filling a lower portion of the first trench 106. For example, the first capping pattern 153 may be formed to expose the protection layer 150 on the first surface 102 of the substrate 100.

An annealing process may be formed on the first capping pattern 153. For example, a wet annealing process may be performed on the first capping pattern 153 in an ambient containing hydrogen and oxygen. As a result of the annealing process, impurities may be removed from the first capping pattern 153.

Figure 4E:
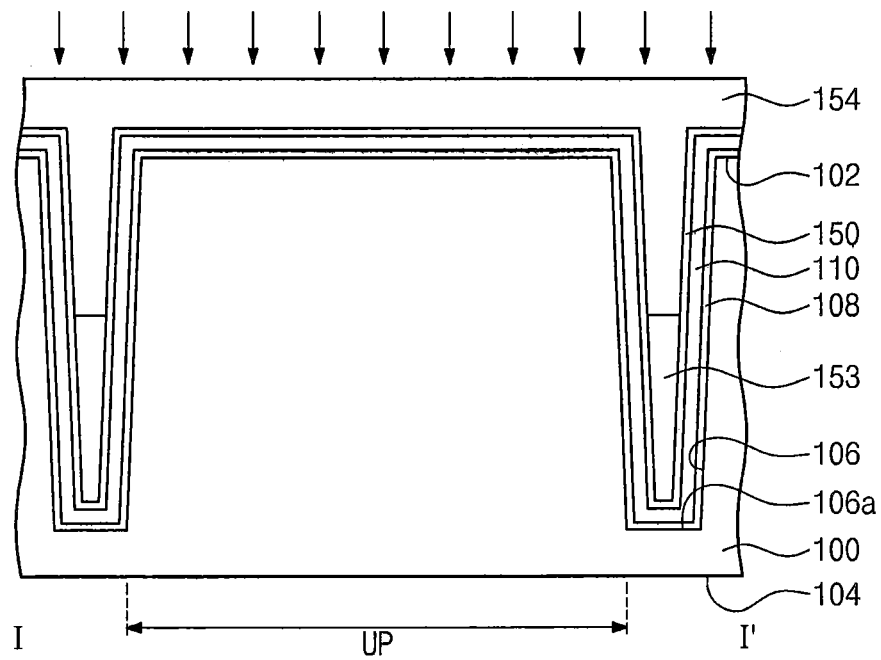

Referring to FIGS. 2 and 4E, a second capping layer 154 may be formed on the first capping pattern 153. The second capping layer 154 may be formed to fill the first trench 106 and cover the protection layer 150 formed on the first surface 102 of the substrate 100. The second capping layer 154 may fill an upper portion of the first trench 106 that is not filled with the first capping pattern 153. The second capping layer 154 may be formed of a fluidic insulating material. For example, the second capping layer 154 may be formed of or include Tonen SilaZene (TOSZ).

An annealing process may be performed on the second capping layer 154. For example, a wet annealing process may be performed on the second capping layer 154 in an ambient containing hydrogen and oxygen. As a result of the annealing process, impurities may be removed from the second capping layer 154.

Because the first trench 106 has a high aspect ratio, in the case where the annealing process is performed only once, it may be difficult to remove impurities from an insulating material filling the first trench 106. According to some embodiments, the first capping pattern 153 and the second capping layer 154, which are formed of, for example, the same insulating material, may be separately formed to fill the first trench 106. Further, the annealing process may be performed twice, including once after forming the first capping pattern 153 and once again after forming the second capping layer 154. Accordingly, it may be possible to remove impurities from the first capping pattern 153 and the second capping layer 154 more efficiently and improve stability of the insulating structure including the first capping pattern 153 and the second capping layer 154.

Figure 4F:
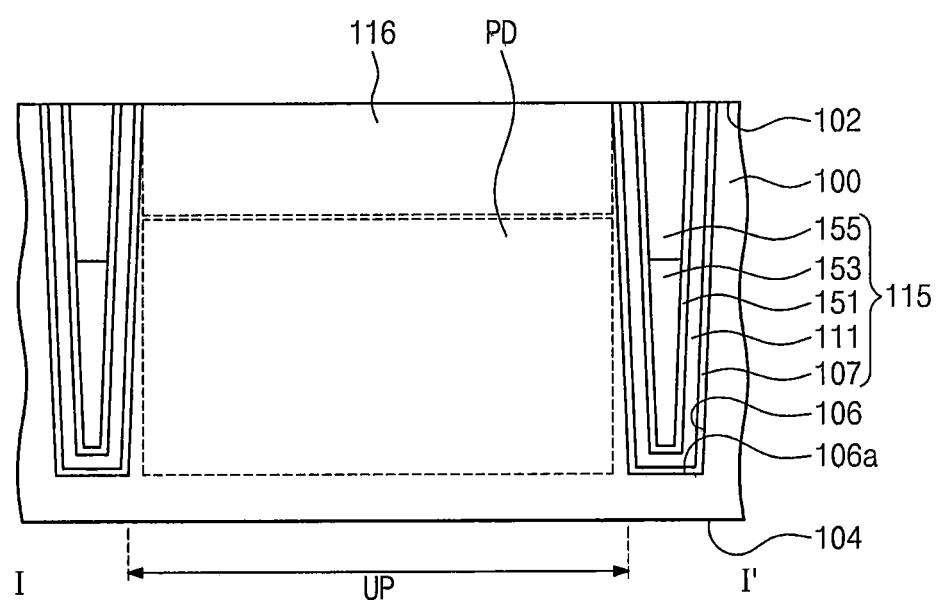

Referring to FIGS. 2 and 4F, a polishing/etching process may be performed on the resulting structure including the second capping layer 154. For example, the polishing/etching process may be performed to remove the second capping layer 154, the protection layer 150, the second passivation layer 110, and/or the first passivation layer 108 from the first surface 102 of the substrate 100. Accordingly, the deep device isolation layer 115 may be formed in the first trench 106. The deep device isolation layer 115 may include, for example, the first passivation pattern 107, the second passivation pattern 111, a protection pattern 151, the first capping pattern 153, and a second capping pattern 155.

In other words, as a result of the polishing/etching process, the first passivation layer 108 and the second passivation layer 110 may be localized in the first trench 106 and may be used as (e.g., may become) the first passivation pattern 107 and the second passivation pattern 111, respectively. Similarly, the protection layer 150 and the second capping layer 154 may be localized in the first trench 106 and may be used as (e.g., may become) the protection pattern 151 and the second capping pattern 155, respectively.

The photoelectric conversion device PD and the well region 116 may be formed in the unit pixel region UP of the substrate 100. The photoelectric conversion device PD may be formed vertically spaced apart from the first surface 102 of the substrate 100. The well region 116 may be formed to have a depth smaller/shallower than that of the photoelectric conversion device PD, when measured from the first surface 102 of the substrate 100. For example, the well region 116 may be formed between the photoelectric conversion device PD and the first surface 102 of the substrate 100. The photoelectric conversion device PD and the well region 116 may be formed to have different conductivity types from each other. For example, the photoelectric conversion device PD may be doped to have an n-type conductivity, and the well region 116 may be doped to have a p-type conductivity.

Figure 4G:
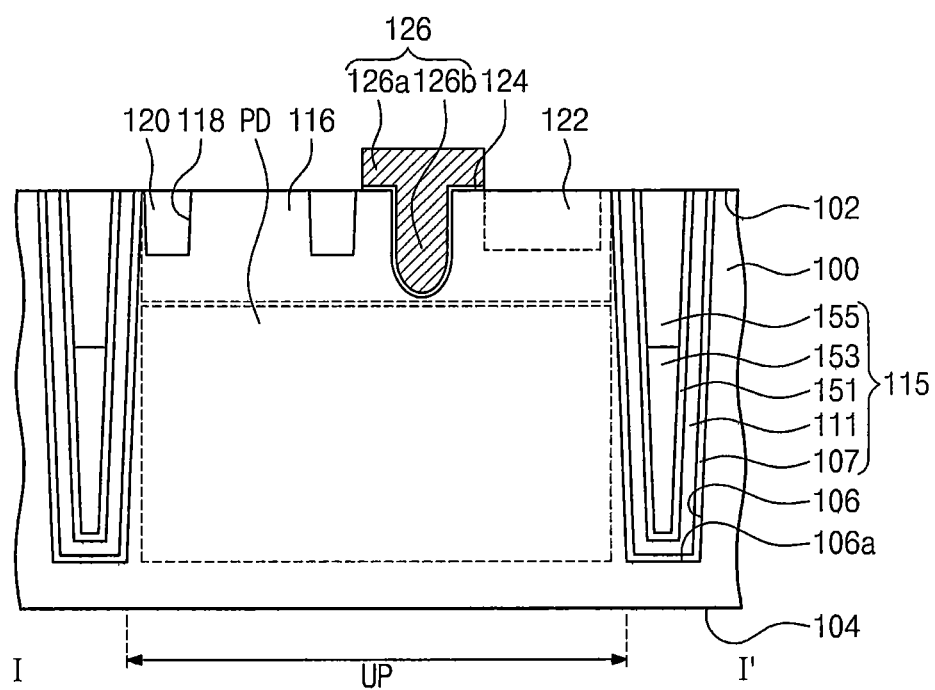

Referring to FIGS. 2 and 4G, the shallow device isolation layer 120 may be formed on the substrate 100. In some embodiments, the shallow device isolation layer 120 may be formed before forming the first trench 106 for the deep device isolation layer 115.

The transfer gate 126 may be formed on the first surface 102 of the substrate 100. The transfer gate 126 may include the first gate pattern 126a and the second gate pattern 126b. The first gate pattern 126a may be formed in the substrate 100 (for example, in the well region 116). The second gate pattern 126b may include a portion protruding from the first surface 102 of the substrate 100 and may be connected to the first gate pattern 126a. The gate insulating layer 124 may be interposed between the transfer gate 126 and the substrate 100.

The floating diffusion region 122 may be formed in the well region 116 of the substrate 100. The floating diffusion region 122 may be formed between the transfer gate 126 and the deep device isolation layer 115. The floating diffusion region 122 may be formed to have a different conductivity type from that of the well region 116.

Figure 4H:
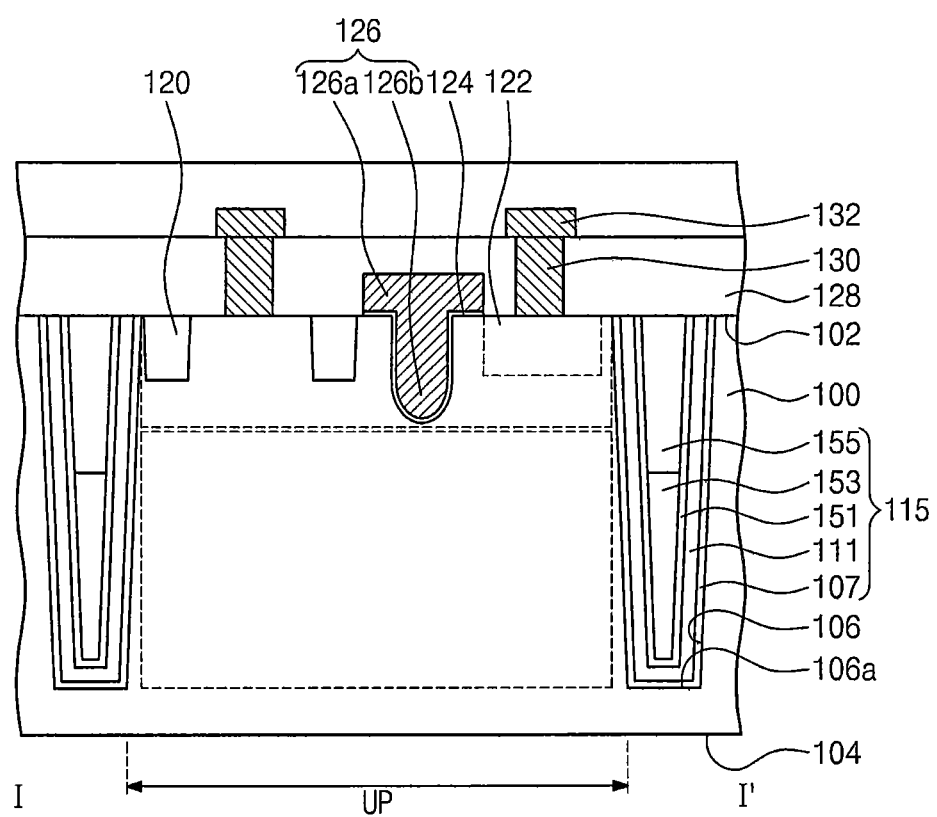

Referring to FIGS. 2 and 4H, the interlayer insulating layer 128 may be formed on the first surface 102 of the substrate 100. The through vias 130 may be formed to penetrate the interlayer insulating layer 128 and the interconnection lines 132 may be formed to be in contact with the through vias 130. At least one of the through vias 130 may be in contact with the floating diffusion region 122.

Figure 4I:
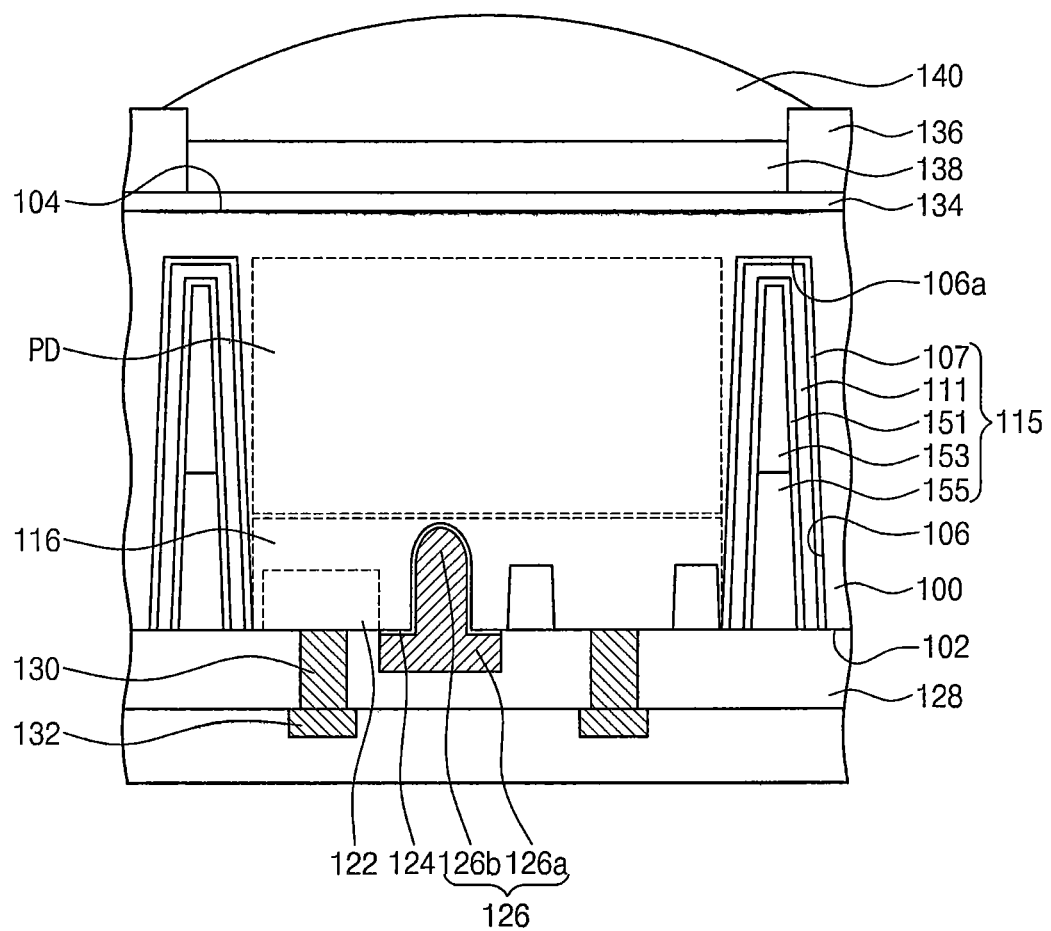

Referring to FIGS. 2 and 4I, the anti-reflecting (e.g., anti-reflective/anti-reflection) layer 134 may be formed on the second surface 104 of the substrate 100. In some embodiments, the separation part 136 may be formed on an edge region of the anti-reflecting layer 134. The color filter 138 and the micro lens 140 may be formed on the anti-reflecting layer 134.

Figure 5:
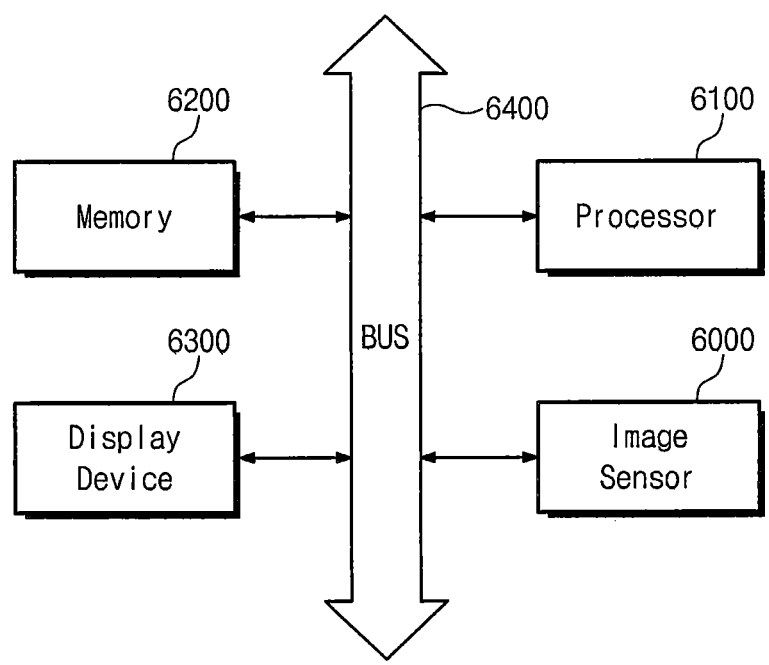
FIG. 5 is a schematic block diagram illustrating an example of electronic devices including an image sensor according to example embodiments of present inventive concepts.

FIG. 5 is a schematic block diagram illustrating an example of electronic devices including an image sensor according to example embodiments of present inventive concepts.

The electronic device may be a digital camera or a mobile device. Referring to FIG. 5, the electronic device may include an image sensor 6000, a processor 6100, a memory 6200, a display 6300, and a bus 6400. The image sensor 6000 may capture information of/for an external image (hereinafter image data) in response to control signals from the processor 6100. The processor 6100 may transmit the captured image data to the memory 6200 through the bus 6400 and store the captured image data in the memory 6200. The processor 6100 may also output the image data stored in the memory 6200 through the display 6300.

According to example embodiments of present inventive concepts, a method of fabricating an image sensor may include forming a first passivation layer doped with impurity ions on an inner surface of a first trench using an atomic layer deposition process. Accordingly, it may be possible to protect/prevent a substrate exposed by the inner surface of the first trench from being damaged, when the first passivation layer doped with impurity ions is formed.

According to example embodiments of present inventive concepts, the method may include forming a capping pattern to fill the first trench. The capping pattern may be formed by forming a fluidic insulating material in the first trench using a spin coating method and performing an annealing process thereon. The use of the fluidic insulating material makes it possible to uniformly or completely fill the first trench with the capping pattern, and the use of the annealing process makes it possible to remove impurities from the capping pattern and thereby improve an insulating property of the capping pattern.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of fabricating an image sensor, the method comprising:
    etching a first surface of a substrate to form a trench defining a unit pixel region, the substrate further comprising a second surface opposite the first surface;
    performing an atomic layer deposition process to form a passivation layer conformally covering a surface of the trench, the passivation layer being doped with impurity ions during the atomic layer deposition process;
    forming a capping pattern on the passivation layer to fill the trench;
    forming a photoelectric conversion part in the unit pixel region; and
    forming a floating diffusion region in the unit pixel region, wherein the floating diffusion region is spaced apart from and overlaps the photoelectric conversion part.

2. The method of claim 1, wherein forming the passivation layer comprises:
    supplying a silicon precursor and the impurity ions to the surface of the trench; and
    supplying an oxygen precursor to the surface of the trench,
    wherein the silicon precursor and the oxygen precursor are reacted with each other, thereby forming a silicon oxide layer doped with the impurity ions on the surface of the trench.

3. The method of claim 1,
    wherein the passivation layer comprises a plurality of stacked layers, each of which is doped with the impurity ions, and
    wherein performing the atomic layer deposition process to form the passivation layer comprises performing the atomic layer deposition process to form the plurality of stacked layers doped with the impurity ions.

4. The method of claim 1, further comprising performing an annealing process on the passivation layer to diffuse the impurity ions from the passivation layer into the substrate.

5. The method of claim 1, wherein forming the capping pattern comprises:
    forming, using a spin coating process, a capping layer to fill the trench that includes the passivation layer;
    performing an annealing process on the capping layer; and
    polishing the capping layer to expose the first surface of the substrate.

6. The method of claim 5,
    wherein the capping layer comprises Tonen SilaZene (TOSZ), and
    wherein forming the capping layer comprises forming, using the spin coating process, the capping layer comprising the TOSZ to fill the trench that includes the passivation layer.

7. The method of claim 1, further comprising:
    forming a transfer gate on the unit pixel region and on the first surface of the substrate, the transfer gate being spaced apart from the floating diffusion region;
    forming a color filter on the second surface of the substrate to face the photoelectric conversion part; and
    forming a micro lens on the color filter.

8. A method of fabricating an image sensor, the method comprising:
    etching a first surface of a substrate to form a trench defining a unit pixel region, the substrate further comprising a second surface opposite the first surface;
    performing an atomic layer deposition process to form a passivation layer conformally covering a surface of the trench, the passivation layer being doped with impurity ions during the atomic layer deposition process;
    forming a protection layer on the passivation layer;
    forming a first capping pattern on the protection layer to partially fill the trench;
    forming a second capping pattern on the first capping pattern to fill a remaining space of the trench;
    forming a photoelectric conversion part in the unit pixel region of the substrate; and
    forming a floating diffusion region in the unit pixel region of the substrate, the floating diffusion region being adjacent the first surface of the substrate and spaced apart from the photoelectric conversion part.

9. The method of claim 8, wherein forming the passivation layer comprises:
    supplying a silicon precursor and the impurity ions to the surface of the trench; and
    supplying an oxygen precursor to the surface of the trench, wherein the silicon precursor and the oxygen precursor are reacted with each other on the surface of the trench, thereby forming a silicon oxide layer doped with the impurity ions.

10. The method of claim 8,
wherein the passivation layer comprises a plurality of stacked layers, each of which is doped with the impurity ions, and
wherein performing the atomic layer deposition process to form the passivation layer comprises performing the atomic layer deposition process to form the plurality of stacked layers doped with the impurity ions.

11. The method of claim 8, wherein forming the first capping pattern comprises:
forming a first capping layer using a spin coating process to fill the trench and cover the protection layer; and
etching the first capping layer to expose an upper side surface of the protection layer in the trench.

12. The method of claim 8, further comprising performing an annealing process on the passivation layer to diffuse the impurity ions from the passivation layer into the substrate.

13. The method of claim 8, wherein forming the second capping pattern comprises:
forming a second capping layer using a spin coating process to fill the trench that includes the first capping pattern; and
polishing the second capping layer to expose at least the protection layer on the first surface of the substrate.

14. The method of claim 8, further comprising performing an annealing process on at least one of the first and second capping patterns.

15. The method of claim 8,
wherein the first and second capping patterns comprise Tonen SilaZene (TOSZ), and
wherein forming the first and second capping patterns comprises forming the first and second capping patterns comprising the TOSZ in the trench.

16. A method of forming an image sensor, the method comprising:
forming a trench in a substrate to define a unit pixel region of the substrate;
forming an in-situ-doped passivation layer on an exposed surface of the trench;
forming a capping pattern on the in-situ-doped passivation layer, in the trench;
forming a photoelectric conversion region in the unit pixel region; and
forming a floating diffusion region in the unit pixel region.

17. The method of claim 16, wherein forming the in-situ-doped passivation layer comprises forming impurities in the passivation layer without using plasma and without using ion implantation.

18. The method of claim 17, further comprising annealing to diffuse the impurities from the passivation layer into the substrate, before forming the capping pattern.

19. The method of claim 18,
wherein forming the capping pattern comprises forming a first capping pattern to partially fill the trench, and
wherein the method further comprises:
performing a first annealing process on the first capping pattern;
forming a second capping pattern on the first capping pattern, in the trench; and
performing a second annealing process on the second capping pattern.

20. The method of claim 18, wherein:
forming the trench comprises forming spaced-apart first and second trenches in the substrate to define the unit pixel region;
forming the in-situ-doped passivation layer comprises performing an atomic layer deposition process to form the in-situ-doped passivation layer;
forming the capping pattern comprises using a spin coating process to form the capping pattern on the in-situ-doped passivation layer, in the trench;
performing an annealing process on the capping pattern;
the method further comprises forming a well region in the substrate;
the method further comprises forming a gate pattern in the well region; and
the floating diffusion region is between the gate pattern and the first trench and is closer to the first trench than to the second trench.

* * * * *